US009311181B2

(12) United States Patent
Lee et al.

(10) Patent No.: US 9,311,181 B2
(45) Date of Patent: Apr. 12, 2016

(54) MEMORY CONTROLLER CHANGING PARTIAL DATA IN MEMORY DEVICE AND METHOD FOR CHANGING PARTIAL DATA THEREOF

(71) Applicants: Kijun Lee, Seoul (KR); Junjin Kong, Yongin-si (KR); Hong Rak Son, Anyang-si (KR); Sejin Lim, Seoul (KR)

(72) Inventors: Kijun Lee, Seoul (KR); Junjin Kong, Yongin-si (KR); Hong Rak Son, Anyang-si (KR); Sejin Lim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 86 days.

(21) Appl. No.: 14/071,771

(22) Filed: Nov. 5, 2013

(65) Prior Publication Data

US 2014/0136920 A1 May 15, 2014

(30) Foreign Application Priority Data

Nov. 15, 2012 (KR) ........................ 10-2012-0129548
Nov. 15, 2012 (KR) ........................ 10-2012-0129549

(51) Int. Cl.

| | |
|---|---|
| ***G06F 11/10*** | (2006.01) |
| ***G06F 11/14*** | (2006.01) |
| ***G06F 12/08*** | (2006.01) |
| ***H03M 13/09*** | (2006.01) |
| ***H03M 13/29*** | (2006.01) |

(52) U.S. Cl.

CPC ........ *G06F 11/1048* (2013.01); *G06F 11/1076* (2013.01); *G06F 11/1435* (2013.01); *G06F 12/0804* (2013.01); *G06F 12/0868* (2013.01); *H03M 13/09* (2013.01); *H03M 13/2942* (2013.01)

(58) Field of Classification Search

CPC ............ G06F 11/1076; G06F 11/1435; G06F 12/0804; G06F 12/0868; G06F 11/1068; G06F 3/0679; G06F 11/08; H03M 13/09; H03M 13/2942

USPC .................................................. 714/758, 763

See application file for complete search history.

(56) References Cited

U.S. PATENT DOCUMENTS

| | | | | |
|---|---|---|---|---|
| 7,100,097 | B2 | 8/2006 | Patella et al. | |
| 7,191,379 | B2 | 3/2007 | Adelmann et al. | |
| 7,467,335 | B2 | 12/2008 | Otto et al. | |
| 7,653,861 | B2 * | 1/2010 | Kanai et al. | 714/758 |
| 7,710,764 | B2 * | 5/2010 | Osada et al. | 365/156 |
| 7,761,780 | B2 * | 7/2010 | Kanai | 714/805 |
| 7,783,941 | B2 | 8/2010 | Kim | |
| 7,823,045 | B2 * | 10/2010 | Chen et al. | 714/763 |
| 7,827,463 | B2 * | 11/2010 | Otsuka et al. | 714/753 |
| 7,945,840 | B2 | 5/2011 | Schreck et al. | |

(Continued)

FOREIGN PATENT DOCUMENTS

| | | |
|---|---|---|
| JP | 06342405 | 12/1994 |
| JP | 07152499 | 6/1995 |

(Continued)

*Primary Examiner* — James C Kerveros

(74) *Attorney, Agent, or Firm* — Harness, Dickey & Pierce, P.L.C.

(57) ABSTRACT

A partial data changing method of a memory controller includes receiving a request to change partial data from a host; detecting an error of old data, the old data being partial data read from a memory device using an error detection code; if the old data is not erroneous, calculating a data difference between new data provided from the host and the old data, and calculating a new parity using the data difference and an old parity read from the memory device; and storing the new data and the new parity at the memory device.

30 Claims, 21 Drawing Sheets

(56) References Cited

U.S. PATENT DOCUMENTS

| | | | | |
|---|---|---|---|---|
| 7,954,034 | B1 * | 5/2011 | Curry et al. | 714/758 |
| 8,132,086 | B2 | 3/2012 | Park et al. | |
| 8,381,070 | B2 | 2/2013 | Arai | |
| 8,700,975 | B2 * | 4/2014 | Yoshihara | 714/770 |
| 8,769,188 | B2 * | 7/2014 | Tu et al. | 711/103 |
| 2011/0191649 | A1 | 8/2011 | Lim et al. | |
| 2011/0231737 | A1 | 9/2011 | Dachiku | |
| 2012/0017139 | A1 | 1/2012 | Otsuka | |
| 2013/0268822 | A1 * | 10/2013 | Manoochehri et al. | 714/758 |
| 2014/0245106 | A1 * | 8/2014 | Leininger et al. | 714/764 |
| 2015/0089316 | A1 * | 3/2015 | Zhang et al. | 714/755 |

FOREIGN PATENT DOCUMENTS

| | | | |
|---|---|---|---|
| JP | 11212877 | | 8/1999 |
| JP | 2000259496 | A | 9/2000 |
| JP | 2001337759 | A | 12/2001 |
| JP | 2005085357 | A | 3/2005 |
| JP | 2012022422 | A | 2/2012 |
| KR | 20000020100 | A | 4/2000 |
| KR | 20030051996 | A | 6/2003 |
| KR | 20060022144 | A | 3/2006 |
| KR | 20080075750 | A | 8/2008 |
| KR | 20110082978 | A | 7/2011 |

* cited by examiner

| LOC | d1 | d2 | d3 | d4 | P |
|---|---|---|---|---|---|
| $D_{old}$ | 0 | 0 | 1 | 1 | 0 |
| $D_{new}$ | 0 (new) | 1 (new) | 1 | 1 | $P_{new}$ |

| LOC | d1 | d2 |
|---|---|---|
| $D_{old}$ | 0 | 0 |
| $D_{new}$ | 0 | 1 |
| $D_{dif}$ | 0 | 1 |

| $P_{old}$ | $D1_{dif}$ | $D2_{dif}$ | $P_{new}$ |
|---|---|---|---|
| 0 | 0 | 1 | 1 |

Fig. 13

| ROW \ LOC | d0~d7 | d8~d15 | d16~d23 | d24~d31 | d32~d39 | d40~47 | d48~d55 | d56~d63 | P0~P7 |
|---|---|---|---|---|---|---|---|---|---|
| R1 | 11111111 | 00100110 | 01001001 | 10010000 | 00010000 | 00010011 | 00011100 | 11100000 | 10000000 |
| R2 | 11100000 | 11111111 | 00100110 | 01001001 | 10010000 | 00010000 | 00010011 | 00011100 | 01000000 |
| R3 | 00011100 | 11100000 | 11111111 | 00100110 | 01001001 | 10010000 | 00010000 | 00010011 | 00100000 |
| R4 | 00010011 | 00011100 | 11100000 | 11111111 | 00100110 | 01001001 | 10010000 | 00010000 | 00010000 |
| R5 | 00010000 | 00010011 | 00011100 | 11100000 | 11111111 | 00100110 | 01001001 | 10010000 | 00001000 |
| R6 | 10010000 | 00010000 | 00010011 | 00011100 | 11100000 | 11111111 | 00100110 | 01001001 | 00000100 |
| R7 | 01001001 | 10010000 | 00010000 | 00010011 | 00011100 | 11100000 | 11111111 | 01001100 | 00000010 |
| R8 | 00100110 | 01001001 | 10010000 | 00010000 | 00010011 | 00011100 | 11100000 | 11111111 | 00000001 |

Fig. 14

| | | | | | | | | |
|---|---|---|---|---|---|---|---|---|
| 11111111 | 00100110 | 01001001 | 10010000 | 00010000 | 00010011 | 00011100 | 11100000 | 10000000 |
| 11100000 | 11111111 | 00100110 | 01001001 | 10010000 | 00010000 | 00010011 | 00011100 | 01000000 |
| 00011100 | 11100000 | 11111111 | 00100110 | 01001001 | 10010000 | 00010000 | 00010011 | 00100000 |
| 00010011 | 00011100 | 11100000 | 11111111 | 00100110 | 01001001 | 10010000 | 00010000 | 00010000 |
| 00010000 | 00010011 | 00011100 | 11100000 | 11111111 | 00100110 | 01001001 | 10010000 | 00001000 |
| 10010000 | 00010000 | 00010011 | 00011100 | 11100000 | 11111111 | 00100110 | 01001001 | 00000100 |
| 01001001 | 10010000 | 00010000 | 00010011 | 00011100 | 11100000 | 11111111 | 01001100 | 00000010 |
| 00100110 | 01001001 | 10010000 | 00010000 | 00010011 | 00011100 | 11100000 | 11111111 | 00000001 |

Fig. 15

| d0~d7 Section 1 | d8~d15 Section 2 | d16~d23 Section 3 | d24~d31 Section 4 | d32~d39 Section 5 | d40~47 Section 6 | d48~d55 Section 7 | d56~d63 Section 8 | P |
|---|---|---|---|---|---|---|---|---|
| 11111111 | 00100110 | 01001001 | 10010000 | 00010000 | 00010011 | 00011100 | 11100000 | 10000000 |
| 11100000 | 11111111 | 00100110 | 01001001 | 10010000 | 00010000 | 00010011 | 00011100 | 01000000 |
| 00011100 | 11100000 | 11111111 | 00100110 | 01001001 | 10010000 | 00010000 | 00010011 | 00100000 |
| 00010011 | 00011100 | 11100000 | 11111111 | 00100110 | 01001001 | 10010000 | 00010000 | 00010000 |
| 00010000 | 00010011 | 00011100 | 11100000 | 11111111 | 00100110 | 01001001 | 10010000 | 00001000 |
| 10010000 | 00010000 | 00010011 | 00011100 | 11100000 | 11111111 | 00100110 | 01001001 | 00000100 |
| 01001001 | 10010000 | 00010000 | 00010011 | 00011100 | 11100000 | 11111111 | 01001100 | 00000010 |
| 00100110 | 01001001 | 10010000 | 00010000 | 00010011 | 00011100 | 11100000 | 11111111 | 00000001 |

Fig. 16

<table>
<tr><td>Partial DATA1</td><td>Parity for EDC of partial DATA1</td><td rowspan="4">Parity for ECC of whole DATA</td></tr>
<tr><td>Partial DATA2</td><td>Parity for EDC of partial DATA2</td></tr>
<tr><td>⋮</td><td>⋮</td></tr>
<tr><td>Partial DATAn</td><td>Parity for EDC of partial DATAn</td></tr>
</table>

Fig. 17

<table>
<tr><td>Partial DATA1</td><td>Parity for ECC of partial DATA1</td><td rowspan="4">Parity for ECC of whole DATA</td></tr>
<tr><td>Partial DATA2</td><td>Parity for ECC of partial DATA2</td></tr>
<tr><td>⋮</td><td>⋮</td></tr>
<tr><td>Partial DATAn</td><td>Parity for ECC of partial DATAn</td></tr>
</table>

MEMORY CONTROLLER CHANGING PARTIAL DATA IN MEMORY DEVICE AND METHOD FOR CHANGING PARTIAL DATA THEREOF

CROSS-REFERENCE TO RELATED APPLICATIONS

A claim for priority under 35 U.S.C. §119 is made to Korean Patent Application Nos. 10-2012-0129548 and 10-2012-0129549 filed Nov. 15, 2012, in the Korean Intellectual Property Office, the entire contents of each of which are hereby incorporated by reference.

BACKGROUND

The inventive concepts described herein relate to a semiconductor memory system, and more particularly, relate to a memory controller capable of changing partial data in a memory device and a partial data changing method thereof.

A semiconductor memory device is a memory device which is fabricated using semiconductors such as silicon (Si), germanium (Ge), gallium arsenide (GaAs), indium phosphide (InP), and so on. Semiconductor memory devices are classified into volatile memory devices and nonvolatile memory devices.

An error may arise when data is stored at a memory device and stored data is read from the memory device. Various error correction codes may be used to detect and correct such errors. The error correction codes may include an RS (Reed-Solomon) code, a BCH (Bose-Chaudhuri-Hocquenghem) code, an LDPC (Low Density Parity Check) code, and so on.

When data is stored at a memory device, parity bits for error correction may be stored at the memory device together with the data. In the even that data stored at the memory device is partially changed, all data stored together with parity bits may be read out to generate new parity bits. This may mean that a data read time and power consumption increase.

SUMMARY

One example embodiment of the inventive concepts relates to a partial data changing method of a memory controller which comprises receiving a request to change partial data from a host. In one embodiment, the method includes detecting an error of partial data read from a memory device using an error detection code; and if the partial data read from the memory device is not erroneous, calculating a data difference $D_{dif}$ between new data $D_{new}$ provided from the host and partial data $D_{old}$ (hereinafter, referred to as old data) read from the memory device, calculating new parity $P_{new}$ using the data difference and old parity $P_{old}$ read from the memory device, and storing the new data and the new parity at the memory device.

In one embodiment, the partial data changing method further comprises reading whole data from the memory device when the old data is erroneous; and correcting an error of the old data using an error correction code. After an error of the old data is corrected, a difference between new data provided from the host and the error-corrected old data is calculated and new parity $P_{new}$ is calculated using the data difference $D_{dif}$ and old parity $P_{old}$ read from the memory device.

In one embodiment, the data changing method further comprises performing a partial data encoding operation of dividing whole data to be stored at the memory device into a plurality of partial data, generating parity for an error detection code of each partial data, and generating partial encoded data; and performing a whole data encoding operation of generating parity for an error correction code of the whole of partial encoded data after the partial data encoding operation.

In one embodiment, the partial data changing method further comprises performing a whole data encoding operation of generating parity for an error correction code of whole data to be stored at the memory device; and after the whole data encoding operation is performed, dividing whole data to be stored at the memory device into a plurality of partial data; and generating parity for an error detection code of whole data. At the partial data encoding operation, encoded parity on whole data generated at the whole data encoding operation is generated.

One embodiment of the inventive concepts relates to a partial data changing method of a memory controller which comprises receiving a request to change partial data from a host; detecting an error of partial data read from a memory device using an error correction code; and if the partial data read from the memory device is erroneous, correcting the error of the partial data, calculating a data difference Ddif between new data Dnew provided from the host and the error-corrected partial data Dold (hereinafter, referred to as old data), and calculating new parity Pnew using the data difference $D_{dif}$ and old parity $P_{old}$ read from the memory device.

In one embodiment, the partial data changing method further comprises performing a partial data encoding operation of dividing whole data to be stored at the memory device into a plurality of partial data, generating parity for an error correction code of each partial data, and generating partial encoded data; and performing a whole data encoding operation of generating parity for an error correction code of the whole of partial encoded data after the partial data encoding operation.

In one embodiment, the partial data changing method further comprises performing a whole data encoding operation of generating parity for an error correction code of whole data to be stored at the memory device; and after the whole data encoding operation is performed, dividing whole data to be stored at the memory device into a plurality of partial data and generating parity for an error correction code of whole data. At the partial data encoding operation, encoded parity on whole data generated at the whole data encoding operation is generated.

In one embodiment, the partial data changing method further comprises if the partial data read from the memory device is not erroneous, calculating a data difference $D_{dif}$ between new data $D_{new}$ provided from the host and partial data $D_{old}$ read from the memory device and calculating new parity $P_{new}$ using the data difference and old parity $P_{old}$ read from the memory device.

According to at least one example embodiment of the inventive concepts, in the case that a part of data stored at a memory device is changed, new parity may be generated using partial data changed without unmodified data. Since new parity is generated using changed data only, a data read time and power consumption may be reduced. Also, if partial data to be changed is erroneous, an error of new parity may be prevented by detecting and correcting an error early.

An embodiment of the inventive concepts relates to a method of operating a memory controller to update parity information. In one embodiment, the method includes determining a first parity, the first parity being a parity corresponding to an entirety of first data stored in a memory device, the first data including a first portion and a second portion; receiving a request to replace the first portion with new data; calculating a data difference value based on the new data and the first portion; updating the first parity by calculating a new parity of the first data based on the data difference and the first parity; and replacing the first portion in the first data with the new data by storing the new data and the new parity at the memory device.

The data difference and the new parity may be calculated without using the second portion, and the new parity corresponds to the entirety of the first data including the new data and the second portion.

The first portion may include contiguous bits of the first data, the second portion may include contiguous bits of the first data, and the first and second portions may not overlap with one another.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 13 is a table illustrating an example of a parity check matrix;

FIG. 14 is a table illustrating such a case that first one byte data in a parity check matrix of FIG. 13 is changed;

FIG. 15 is a table illustrating an example in which a new parity generating operation on a parity check matrix of FIG. 13 is performed every section;

FIGS. 16 and 17 are tables illustrating a data structure for error detection or correction of partial data;

DETAILED DESCRIPTION

Figure 1:
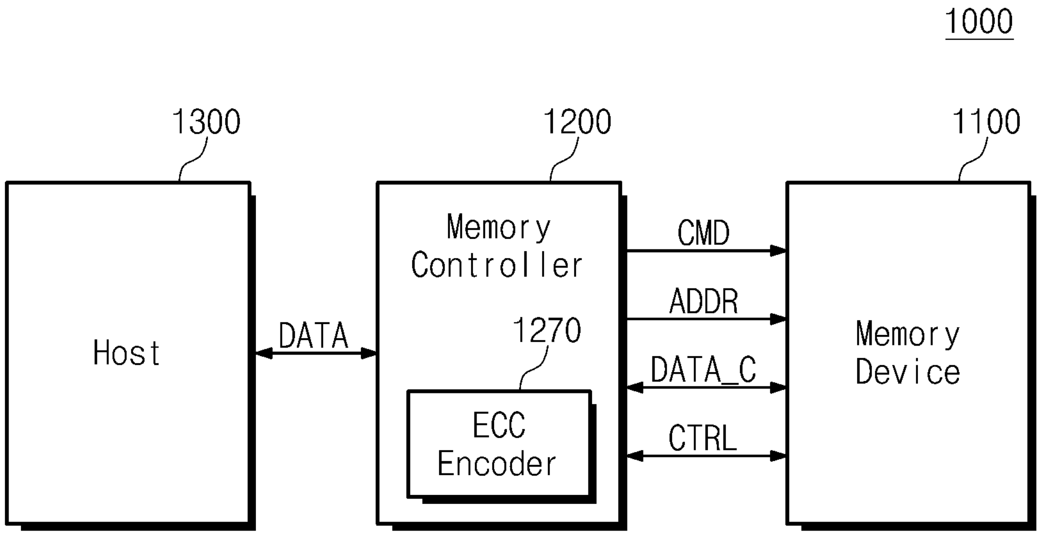
FIG. 1 is a block diagram schematically illustrating a memory system according to an embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms “first”, “second”, “third”, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as “beneath”, “below”, “lower”, “under”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” or “under” other elements or features would then be oriented “above” the other elements or features. Thus, the exemplary terms “below” and “under” can encompass both an orientation of above and below. The device may be otherwise oriented (rotated 90 degrees or at other orientations) and the spatially relative descriptors used herein interpreted accordingly. In addition, it will also be understood that when a layer is referred to as being “between” two layers, it can be the only layer between the two layers, or one or more intervening layers may also be present.

The terminology used herein is for the purpose of describing particular embodiments only and is not intended to be limiting of the inventive concepts. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. As used herein, the term “and/or” includes any and all combinations of one or more of the associated listed items. Also, the term “exemplary” is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

I. Memory System Including ECC Encoder

FIG. 1 is a block diagram schematically illustrating a memory system according to an embodiment of the inventive concepts. Referring to FIG. 1, a memory system 1000 may include a memory device 1100, a memory controller 1200, and a host 1300.

The memory device 1100 may include a volatile memory device and a nonvolatile memory device. The volatile memory device may be a memory device which loses data stored therein at power-off. The volatile memory device may include an SRAM, a DRAM, and so on. The nonvolatile memory device may be a memory device which retains data stored therein even at power-off. The nonvolatile memory device may include a ROM (Read Only Memory), a PROM (Programmable ROM), an EPROM (Electrically Programmable ROM), an EEPROM (Electrically Erasable and Programmable ROM), a flash memory device, a PRAM (Phase-change RAM), an MRAM (Magnetic RAM), an RRAM (Resistive RAM), a FRAM (Ferroelectric RAM), and so on. The memory device 1100 may use various methods for error correction when a bit error is generated in operation.

The memory controller 1200 may be connected between the memory device 1100 and the host 1300. The memory controller 1200 may access the memory device 1100 in response to a request of the host 1300. The memory controller 1200 may receive data from the host 1300 to generate coded data DATA_C. The memory controller 1200 may provide the memory device 1100 with a command CMD, an address ADDR, the coded data DATA_C, and a control signal CTRL.

The memory controller 1200 may receive coded data DATA_C from the memory device 1100, and may decode the coded data DATA_C to restore original data. The memory controller 1200 may send the restored data to the host 1300.

The memory controller 1200 may include an ECC encoder 1270. The ECC encoder 1270 may perform ECC encoding on data to be provided to the memory device 1100 to generate coded data DATA_C to which parity is added. The ECC encoder 1270 may correct an error using the parity.

The ECC encoder 1270 may correct an error using an LDPC (low density parity check) code, a BCH (Bose-Chaudhuri-Hocquenghem) code, a turbo code, an RS (Reed-Solomon code), a convolution code, an RSC (Recursive Systematic Code), or coded modulation such as a TCM (Trellis-Coded Modulation), a BCM (Block Coded Modulation), and so on.

When data stored at the memory device 1100 is partially changed, the ECC encoder 1270 may generate new parity using data partially changed. The memory system 1000 according to an embodiment of the inventive concepts may not use data not changed when generating new parity, so that a data read time and power consumption are reduced.

Figure 2:
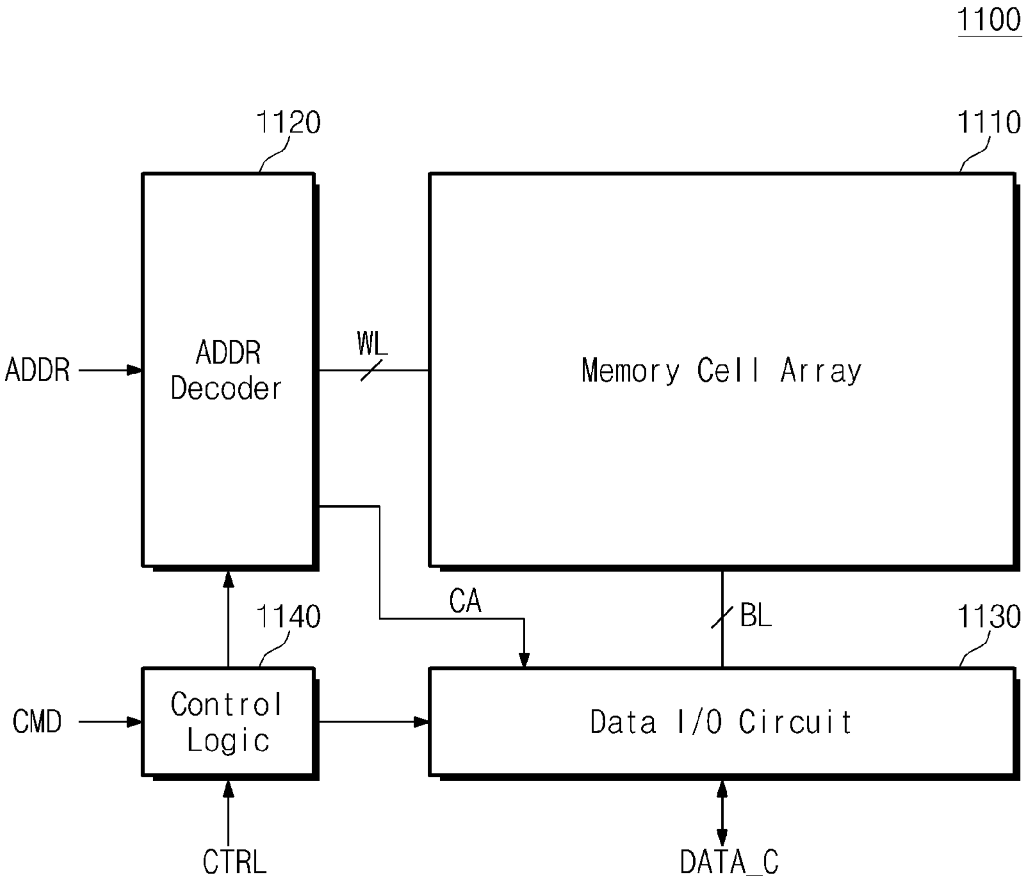
FIG. 2 is a block diagram schematically illustrating a memory device of FIG. 1.

FIG. 2 is a block diagram schematically illustrating a memory device 1100 of FIG. 1. Referring to FIG. 2, a memory device 1100 may include a memory cell array 1110, an address decoder 1120, a data input/output circuit 1130, and control logic 1140.

The memory cell array 1110 may be connected with the address decoder 1120 through word lines WL and with the data input/output circuit 1130 through bit lines BL. The memory cell array 1110 may include a plurality of memory cells. Memory cells arranged in a row direction may be connected with a word line. Memory cells arranged in a column direction may be connected with a bit line. Each memory cell may store one or more data bits.

The address decoder 1120 may be connected with the memory cell array 1110 through the word lines WL. The address decoder 1120 may receive an address ADDR from a memory controller 1200 (refer to FIG. 1). The address ADDR may include a row address and a column address. The address decoder 1120 may select one or more word lines using the row address, and may transfer the column address CA to the data input/output circuit 1130.

The data input/output circuit 1130 may be connected with the memory cell array 1110 through the bit lines BL, and may exchange coded data DATA_C with the memory controller 1200. The data input/output circuit 1130 may operate responsive to a control of the control logic 1140. The data input/output circuit 1130 may select one or more bit lines in response to the column address CA from the address decoder 1120.

The data input/output circuit 1130 may receive coded data DATA_C from an external device (e.g., a memory controller 1200) to provide the coded data DATA_C to the memory cell array 1110. The data input/output circuit 1130 may read coded data DATA_C from the memory cell array 1110 to output the read data DATA_C to the memory controller 1200.

The control logic 1140 may be connected with the address decoder 1120 and the data input/output circuit 1130. The control logic 1140 may control an overall operation (e.g., a read operation, a write operation, etc.) of the memory device 1100 in response to a command CMD and a control signal CTRL from the memory controller 1200.

Figure 3:
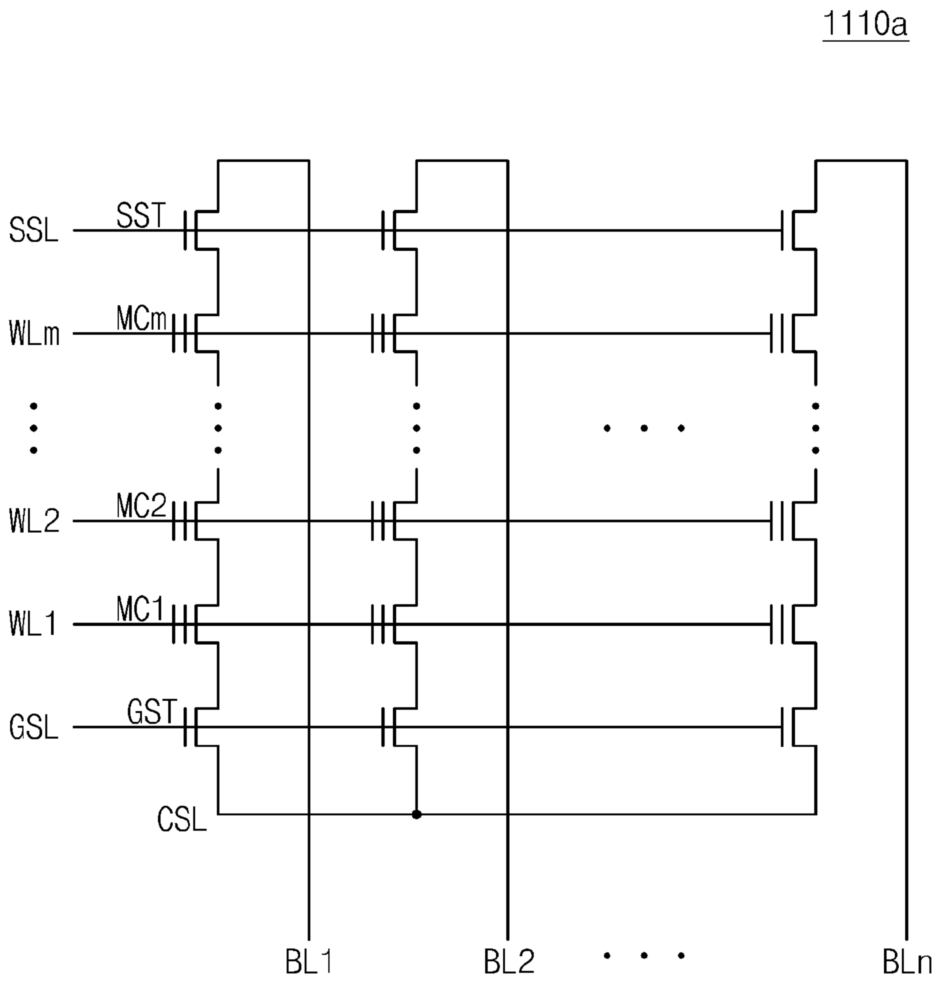
FIGS. 3 and 4 are circuit diagrams schematically illustrating a memory cell array according to embodiments of the inventive concepts.
Figure 4:
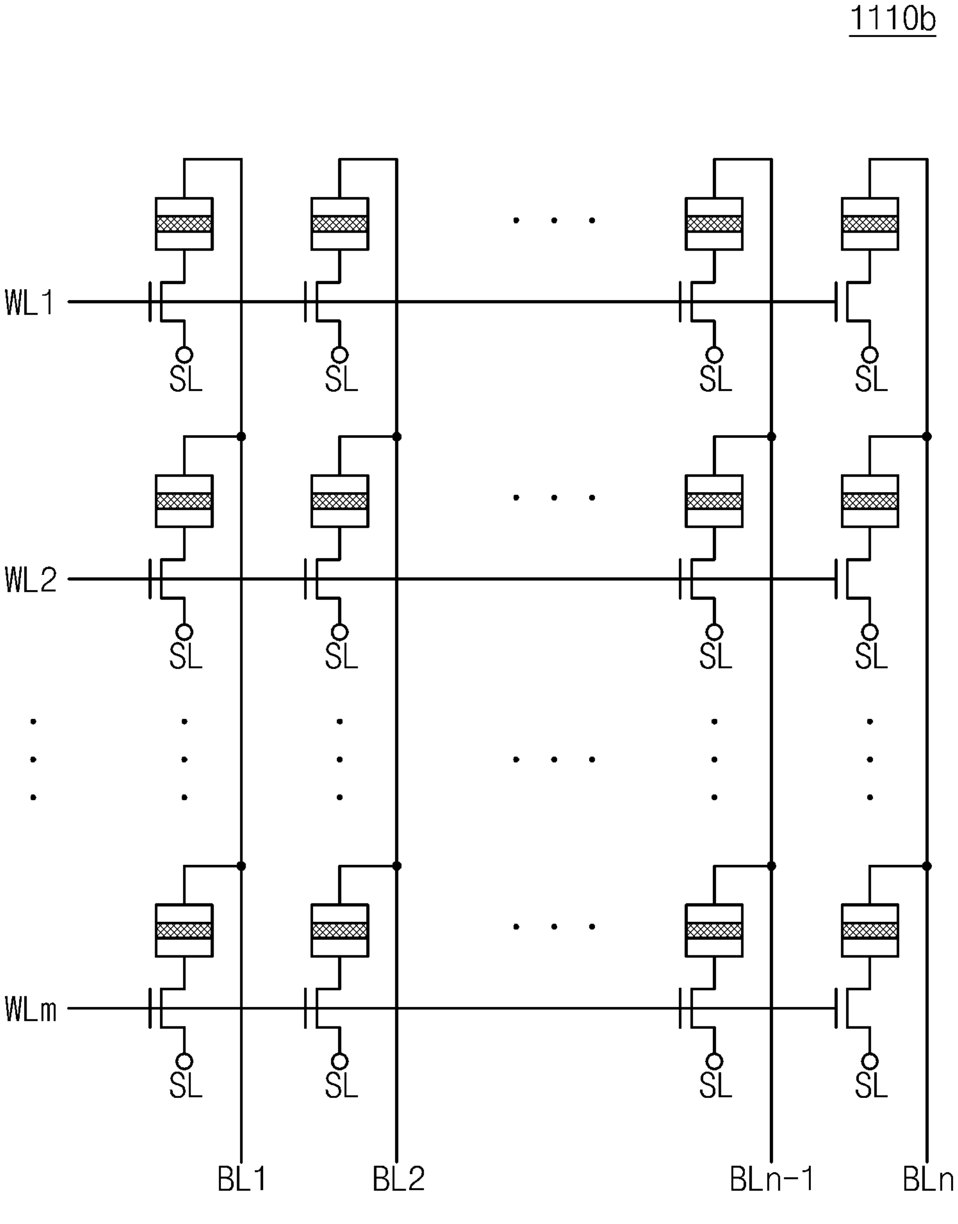

FIGS. 3 and 4 are circuit diagrams schematically illustrating a memory cell array according to embodiments of the inventive concepts. FIG. 3 shows an example of a NAND flash memory, and FIG. 4 shows an example of an STT-MRAM (Spin Transfer Torque Magneto-resistive Random Access Memory).

Referring to FIG. 3, a memory cell array 1110_a_ may include a plurality of flash memory cells. Memory cells MC1 to MCm provided along a row direction may be connected with word lines WL1 to WLm, respectively. Memory cells in the same row may be connected with the same word line. Memory cells MC1 to MCm provided along a column direction may be connected with bit lines BL1 to BLn, respectively. Memory cells in the same column may be connected with the same bit line.

String selection transistors SST may be connected with the bit lines BL1 to BLn and the memory cells MCm, respectively. The string selection transistors SST may be connected with a string selection line SSL. Ground selection transistors GST may be connected with the memory cells MC1 and a common source line CSL, respectively. The ground selection transistors GST may be connected with a ground selection line GSL.

Referring to FIG. 4, a memory cell array 1110*b* may include a plurality of word lines WL1 to WLm, a plurality of bit lines BL1 to BLn, and a plurality of memory cells arranged at intersections of the word lines WL1 to WLm and the bit lines BL1 to BLn.

In the case that a memory cells is formed of an STT-MRAM cell, it may include a cell transistor and a magnetic tunnel junction (MTJ) element having a magnetic material. The MTJ element can be replaced with a resistive element such as a PRAM using a phase change material, an RRAM using a variable resistance material such as complex metal oxide, or the like.

Returning to FIG. 1, a memory system 1000 according to an embodiment of the inventive concepts may be configured such that a memory controller 1200 includes an ECC encoder 1270. When data stored at the memory device 1100 is partially changed, the ECC encoder 1270 according to example embodiments of the inventive concepts may generate new parity using the partially changed data. Since new parity is generated using the partially changed data, a data read time and power consumption may be reduced.

II. New Parity Generating Method on Partially Change Data

Figure 5:
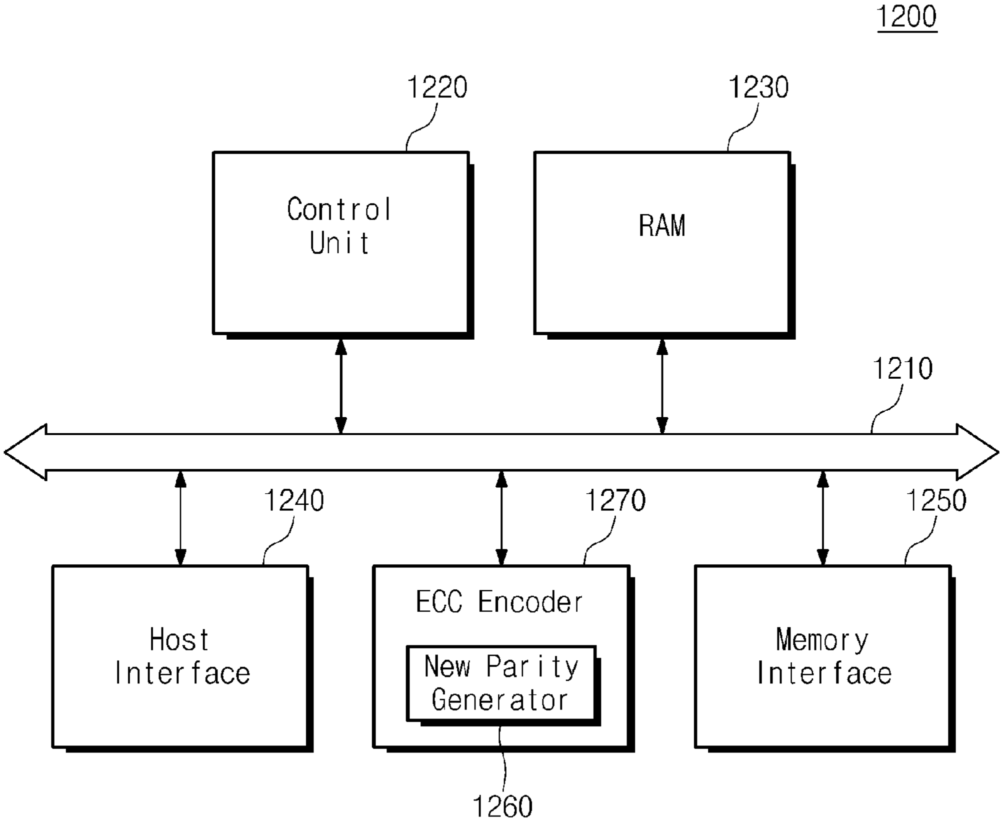
FIG. 5 is a block diagram schematically illustrating memory controller illustrated in FIG. 1.

FIG. 5 is a block diagram schematically illustrating memory controller 1200 illustrated in FIG. 1. Referring to FIG. 5, a memory controller 1200 may include a system bus 1210, a control unit 1220, a RAM 1230, a host interface 1240, a memory interface 1250, and an ECC encoder 1270.

The system bus 1210 may be used as an internal channel of the memory controller 1200. The control unit 1220 may control an overall operation of the memory controller 1200. The RAM 1230 may be used as at least one of a working memory, a cache memory, and a buffer memory of the control unit 1220.

The host interface 1240 may communicate with a host 1300 (refer to FIG. 1) according to the specific communications standard. In example embodiments, the memory controller 1200 may communicate with the host 1300 using at least one of various communications standards such as USB (Universal Serial Bus), PCI (peripheral component interconnection), PCI-E (PCI-express), ATA (Advanced Technology Attachment), Serial-ATA, Parallel-ATA, SCSI (small computer system interface), ESDI (enhanced small disk interface), IDE (Integrated Drive Electronics), and Firewire.

The memory interface 1250 may interface with a memory device 1100 (refer to FIG. 1). For example, the memory interface 1250 may include a NAND flash interface, an MRAM interface, or the like.

The ECC encoder 1270 may perform ECC encoding on data from the host 1300 to provide the memory device 1100 with coded data DATA_C and parity. Herein, the coded data DATA_C may be also referred to ECC data. Assuming that data to be stored at the memory device 1100 is D1, D2, D3, and D4, the parity may be calculated by the following equation 1.

$$P1=D1+D2+D3+D4 \tag{1}$$

In the equation 1, the addition may be an XOR operation or a mod 2 operation. Alternatively, the addition may be an operation corresponding to a non-binary code to a nonlinear code.

As used herein, the operations of adding or subtracting bits may both be achieved by XOR operations.

The ECC encoder 1270 may include a new parity generator 1260. When a part of data stored at the memory device 1100 is changed, the new parity generator 1260 in the ECC encoder 1270 may generate a new parity using partial data changed. The new parity generator 1260 can be placed outside the ECC encoder 1270.

Figures 6, 7:
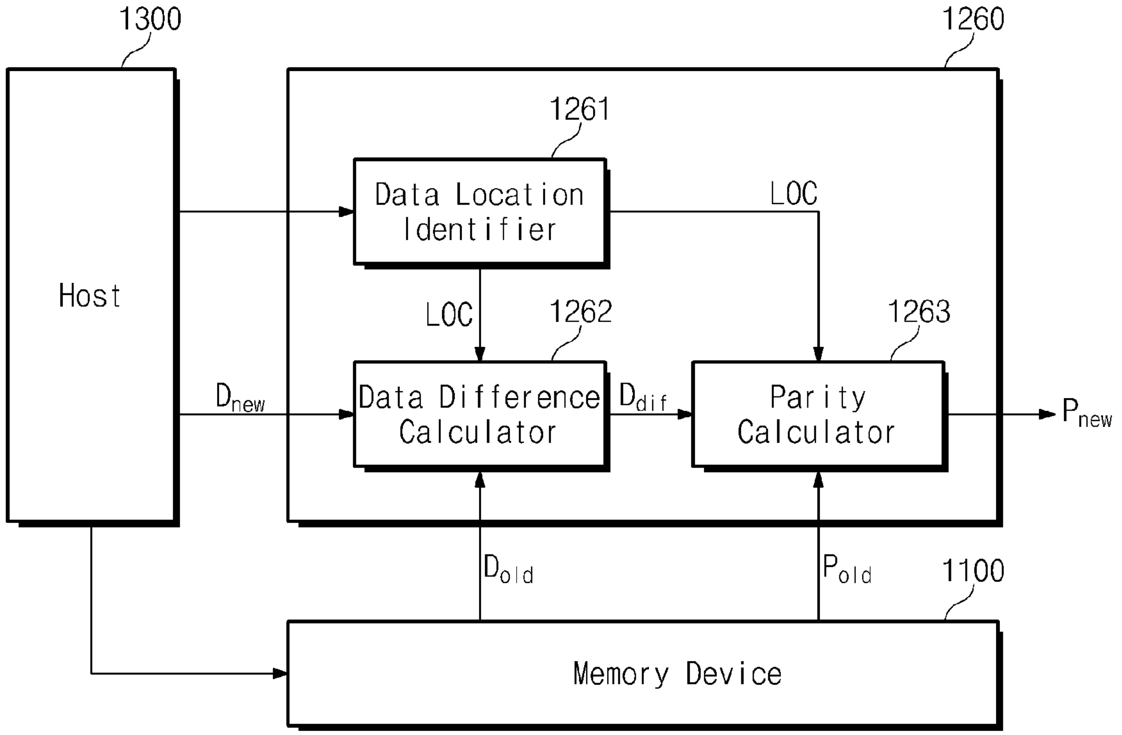
FIG. 6 is a block diagram schematically illustrating a new parity generator of FIG. 5.
FIGS. 7 to 11 are tables and block diagrams for describing an operation of a new parity generator of FIG. 6.

FIG. 6 is a block diagram schematically illustrating a new parity generator of FIG. 5. Referring to FIG. 6, a new parity generator 1260 may comprise a data location identifier 1261, a data difference calculator 1262, and a parity calculator 1263.

The data location identifier 1261 may identify a location of new data Dnew input from a host 1300, and may provide a location signal LOC to the data difference calculator 1262 and the parity calculator 1263. Herein, a location of new data may mean a location of data, to be changed with new data, from among data stored at a memory device 1100.

For example, it is assumed that parity P is generated using four data D1, D2, D3, and D4. As an example, at this time, the data D1 to D4 may be located at locations d1 to d4, respectively. In the event that D1 and D2 are changed with new data, a location of the new data may be d1 and d2. In the descriptions below, old data at a location d1 may be referred to as $D1_{old}$, and new data may be referred to as $D1_{new}$. If old data $D1_{old}$ at a location d1 is changed with new data $D1_{new}$, the data location identifier 1261 may provide the location signal LOC indicating d1.

The data difference calculator 1262 may receive the location signal LOC on new data from the data location identifier 1261, and may calculate a difference between the new data $D_{new}$ from the host 1300 and old data $D_{old}$ stored at the memory device 1100. The data difference calculator 1262 may provide the parity calculator 1263 with a data difference $D_{dif}$ between the new data $D_{new}$ and the old data $D_{old}$.

The parity calculator 1263 may receive the location signal LOC on new data, and may calculate a new parity $P_{new}$ using the data difference $D_{dif}$ from the data difference calculator 1262 and an old parity $P_{old}$ stored at the memory device 1100. An operation of the parity calculator 1263 will be more fully described with reference to FIGS. 10 and 11.

A structure and an operating principle of the new parity generator 1260 may be based on the following mathematical principle. It is assumed that data $D1_{old}$, $D2_{old}$, $D3_{old}$, $D4_{old}$ and parity $P_{old}$ are stored at the memory device 1100.

With the equation 1, an old parity $P_{old}$ may be expressed by:

$$P_{old}=D1_{old}+D2_{old}+D3_{old}+D4_{old}.$$

Herein, if $D1_{old}$ and $D2_{old}$ are replaced with $D1_{new}$ and $D2_{new}$, the old parity $P_{old}$ may be changed. If a part of data stored at the memory device 1100 is changed, a conventional memory system may read all data $D1_{old}$, $D2_{old}$, $D3_{old}$, $D4_{old}$ from the memory device 1100, change data, and calculate new parity $P_{new}$.

With the equation 1, new parity $P_{new}$ may be expressed by:

$$P_{new}=D1_{new}+D2_{new}+D3_{old}+D4_{old}.$$

The new parity $P_{new}$ minus the old parity $P_{old}$ may equal $$(D1_{new}+D2_{new}+D3_{old}+D4_{old})-(D1_{old}+D2_{old}+D3_{old}+D4_{old}).$$

Then, the new parity $P_{new}$ may be expressed by:

$$P_{new}=P_{old}+(D1_{new}+D2_{new}+D3_{old}+D4_{old})-(D1_{old}+D2_{old}+D3_{old}+D4_{old})$$

$$P_{new}=P_{old}+(D1_{new}+D2_{new})-(D1_{old}+D2_{old})$$

$$P_{new}=P_{old}+(D1_{new}-D1_{old})+(D2_{new}-D2_{old})$$

As understood from the above expression, data $D3_{old}$ and $D4_{old}$ not changed may be removed during an arithmetic operation. This may mean that when data stored at the memory device 1100 is partially changed data not changed is unnecessary for the purpose of determining a new parity for the data D1-D4.

A conventional memory system may read all data including data $D3_{old}$ and $D4_{old}$ not changed to calculate new parity. Although a size of ECC data is large and a size of data to be changed is small, the conventional memory system may read all data to generate new parity. For this reason, a lot of data read time and a lot of power may be required.

If data stored at the memory device 1100 is partially changed, the memory system 1000 according to an embodiment of the inventive concepts may generate new parity using data partially changed through the new parity generator 1260 of FIG. 6 without read-out of all data. Thus, a data read time and power consumption may be reduced.

Below, an operation of a new parity generator of FIG. 6 will be more fully described with reference to FIGS. 7 and 11.

Referring to FIG. 7, it is assumed that four old data $D_{old}$ and one old parity P are stored at a memory device 1100. Old data $D_{old}$ at locations d1 to d4 may be 0, 0, 1, and 1. That is, $D1_{old}$ is 0, $D2_{old}$ is 0, $D3_{old}$ is 1, and $D4_{old}$ is 1. Thus, $P_{old}$ (=$D1_{old}$+$D2_{old}$+$D3_{old}$+$D4_{old}$) may be 0 by an XOR operation.

It is assumed that old data $D1_{old}$ and $D2_{old}$ are changed with new data $D1_{new}$ and $D2_{new}$. As illustrated in FIG. 7, $D1_{new}$ may be 0 and $D2_{new}$ may be 1. A new parity generator 1260 of FIG. 6 may generate a new parity $P_{new}$ without unmodified data $D3_{old}$ and $D4_{old}$. Below, a method of obtaining new parity $P_{new}$ without unmodified data $D3_{old}$ and $D4_{old}$ will be described.

Figures 8, 9:
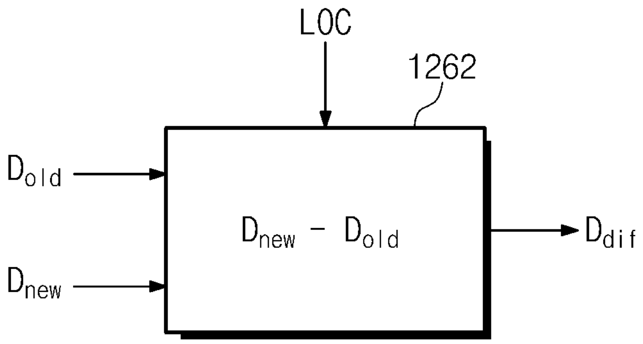

FIG. 8 is a block diagram schematically illustrating a data difference calculator of FIG. 6. Referring to FIG. 8, a data difference calculator 1262 may receive a location signal LOC on new data to calculate a difference between new data $D_{new}$ and old data $D_{old}$. A data difference $D_{dif}$ may be calculated by the following equation 2.

$$D_{dif}=D_{new}-D_{old}=\mathrm{XOR}(D_{old},D_{new}) \quad (2)$$

In the equation 2, the subtraction may be an XOR operation or a mod 2 operation. Alternatively, the subtraction may be an operation corresponding to a non-binary code or to a nonlinear code.

The data difference calculator 1262 may receive a location signal d1 to calculate a difference $D1_{dif}$ between new data $D1_{new}$ and old data $D1_{old}$. Then, the data difference calculator 1262 may receive a location signal d2 to calculate a difference $D2_{dif}$ between new data $D2_{new}$ and old data $D2_{old}$. Herein, the data difference $D1_{dif}$ may mean a difference between the new data $D_{new}$ and the old data $D1_{old}$ which are located at a location d1. Alternatively, the data difference calculator 1262 may receive the location signals d1 and d2 to calculate the data differences $D1_{dif}$ and $D2_{dif}$ at the same time. The data differences $D1_{dif}$ and $D2_{dif}$ may be provided to a parity calculator 1263.

FIG. 9 is a table for describing an operation of a data difference calculator of FIG. 8. As described above, it is assumed that old data $D1_{old}$ and $D2_{old}$ are changed with new data $D1_{new}$ and $D2_{new}$. Since the data $D1_{new}$ and $D1_{old}$ are 0, data diffidence $D1_{dif}$ of the equation 2 may be 0. Since data $D2_{old}$ is 0 and $D2_{new}$ are 1, data diffidence $D2_{dif}$ may be 1.

Figures 10, 11:
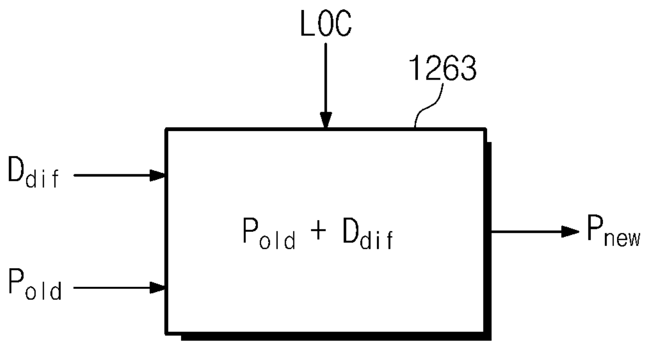

FIG. 10 is a block diagram schematically illustrating a parity calculator of FIG. 6. Referring to FIG. 10, a parity calculator 1263 may receive a location signal LOC on new data to calculate new parity $P_{new}$ using data difference $D_{dif}$ from a data difference calculator 1262 and old parity $P_{old}$ stored at a memory device 1100. The new parity $P_{new}$ may be calculated by the following equation 3.

$$P_{new}=P_{old}+D_{dif} \quad (3)$$

In the above example, $D_{dif}$ may be a sum of $D1_{dif}$ and $D2_{dif}$. $D1_{dif}$ may be a difference between $D1_{new}$ and $D1_{old}$, and $D2_{dif}$ may be a difference between $D2_{new}$ and $D2_{old}$. That is, the equation 3 may be expressed by: $P_{new}=P_{old}+D1_{dif}+D2_{dif}=P_{old}+(D1_{new}-D1_{old})+(D2_{new}-D2_{old})$.

FIG. 11 is a table for describing an operation of a parity calculator of FIG. 10. As calculated using an example of FIG. 9, if $D1_{dif}$ is 0 and $D2_{dif}$ is 1, a total data difference $D_{dif}$ may be 1. Since $P_{old}$ is 0 and $D_{dif}$ is 1, new parity $P_{new}$ may be 1.

Referring to the equation 3, new parity $P_{new}$ may be expressed by a function of the old parity $P_{old}$ and a changed data difference $D_{dif}$. Herein, a function for obtaining the new parity $P_{new}$ may not be associated with unmodified data (e.g., $D3_{old}$ and $D4_{old}$). This may be expanded to a non-binary code or a nonlinear code.

Since a memory system according to an embodiment of the inventive concepts calculates new parity using changed data only, a data read time and power consumption may be reduced. In particular, the memory system according to an embodiment of the inventive concepts may be advantageous to the case that a small size of data is changed.

Figure 12:
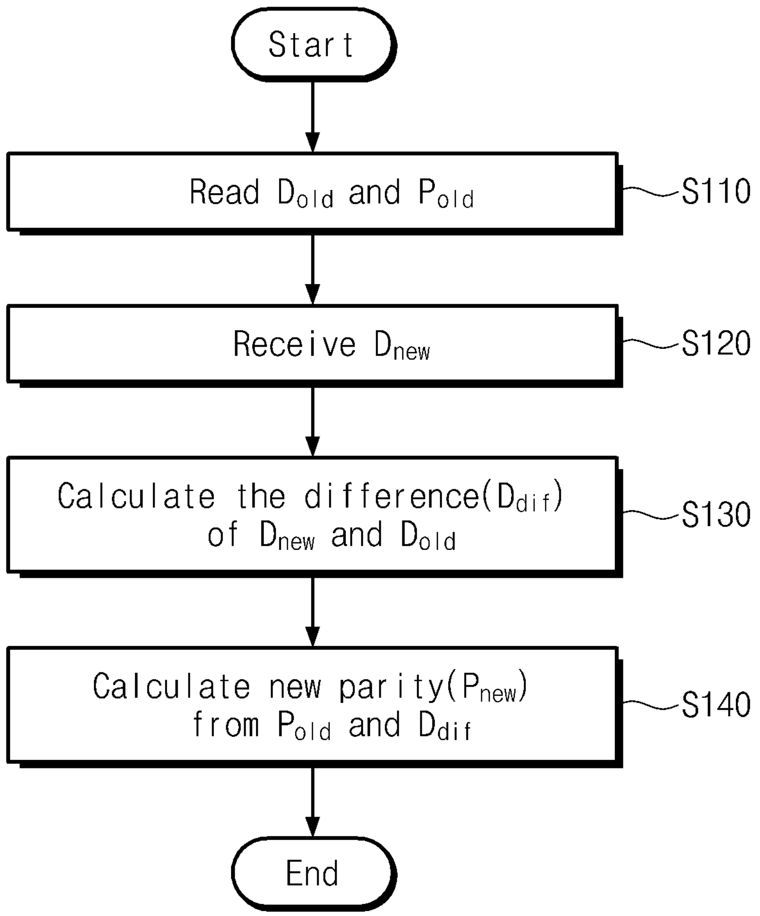
FIG. 12 is a flow chart illustrating a new parity generating method of a memory system according to an embodiment of the inventive concepts.

FIG. 12 is a flow chart illustrating a new parity generating method of a memory system according to an embodiment of the inventive concepts.

In operation S110, a memory controller 1200 (refer to FIG. 1) may read old data $D_{old}$ and an old parity $P_{old}$ from a memory device 1100 (refer to FIG. 1). In operation S120, the memory controller 1200 may receive new data $D_{new}$ from a host 1300 (refer to FIG. 1). In operation S130, the memory controller 1200 may calculate a difference $D_{dif}$ between the old data $D_{old}$ and the new data $D_{new}$. In operation S140, the memory controller 1200 may calculate a new parity $P_{new}$ using the old parity $P_{old}$ and the difference $D_{dif}$.

FIG. 13 is a table illustrating an example of a parity check matrix. Referring to FIG. 13, a code length of data stored at a memory device 1100 (refer to FIG. 1) may be 72 and a data length thereof may be 64. FIG. 13 illustrates data locations d0-d55 which may correspond, respectively, to data D0-D55. In FIG. 13, there is illustrated an example of a parity check matrix of (72, 64) single error correction-double error detection (SEC-DED). Herein, the single error correction-double error detection may mean that one error is corrected and two errors are detected.

In FIG. 13, a row may be expressed by a parity check equation. Parity may be generated by adding code bits at locations corresponding to 1 in a row. For example, parity P0 of a first row R1 may be calculated by the following equation 4.

$$P0=D0+D1+D2+\ldots+D56+D57+D58 \quad (4)$$

Parities P1 to P7 of second to eighth rows R2 to R8 may be calculated in the same manner as the equation 4. The following table 1 may show parities of rows R1 to R8.

TABLE 1

| | |
|---|---|
| P0 | D0 + D1 + D2 + D3 + . . . + D53 + D56 + D57 + D58 |
| P1 | D0 + D1 + D2 + D8 + . . . + D58 + D59 + D60 + D61 |
| P2 | D3 + D4 + D5 + D8 + . . . + D51 + D59 + D62 + D63 |
| P3 | D3 + D6 + D7 + D11 + . . . + D47 + D48 + D51 + D59 |
| P4 | D3 + D11 + D14 + D15 + . . . + D52 + D55 + D56 + D59 |
| P5 | D0 + D3 + D11 + D19 + . . . + D54 + D57 + D60 + D63 |
| P6 | D1 + D4 + D7 + D8 + . . . + D55 + D57 + D57 + D60 + D61 |
| P7 | D2 + D5 + D6 + D9 + . . . + D60 + D61 + D62 + D63 |

A memory system 1000 (refer to FIG. 1) according to an embodiment of the inventive concepts may generate new parities on a plurality of rows. As illustrated in FIG. 13, new parities on the first to eighth rows R1 to R8 may be generated to have a predetermined size. In this case, as described above, if data is partially changed, new parity may be generated using data partially changed, not all data.

FIG. 14 is a table illustrating such a case that first one byte data in a parity check matrix of FIG. 13 is changed. In FIG. 14, unmodified data, that is, data not used to calculate new parity may be marked by X.

If first one byte data of data stored at a memory device 1100 is changed, a conventional memory system may read all data of FIG. 13 to generate new parity. However, a memory system 1000 according to an embodiment of the inventive concepts may read first 1-byte data and 1-byte parity to generate new parity. That is, Referring to the equation 3, the memory system 1000 of the inventive concepts may calculate a difference between one byte of new data $D_{new}$ and one byte of old data $D_{old}$, and may generate new parity $P_{new}$ using the difference $D_{dif}$ and old parity $P_{old}$. Since new parity is calculated using changed data only, a data read time and power consumption may be reduced.

As illustrated in FIG. 14, if new parity is calculated using partial data (e.g., first 1-byte data) of the memory device 1100, ECC encoding may be performed in various methods. For example, ECC encoding may be performed using only modified data. That is, new parity $P_{new}$ may be calculated using a difference $D_{dif}$ of changed data and old parity $P_{old}$. Alternatively, data stored at the memory device 1100 may be divided into sections having a predetermined size, and a new parity generating operation may be performed with respect to sections, respectively.

FIG. 15 is a table illustrating an example in which a new parity generating operation on a parity check matrix of FIG. 13 is performed every section. To perform a new parity generating operation every section, an ECC encoder 1270 may include new parity generators corresponding to sections.

In the event that a first section of data is changed, new parity $P0_{new}$ may be expressed by:

$$P0_{old}+D0_{dif}+D1_{dif}+D2_{dif}+D3_{dif}+D4_{dif}+D5_{dif}+D6_{dif}+D7_{dif}$$

Herein, $D1_{dif}$ may be $(D1_{new}-D1_{old})$. A new parity generator of each section may be designed according to the above equation $P0_{new}$. As illustrated in FIG. 15, if a parity generating operation of each section is performed by the byte, the ECC encoder 1270 may perform a byte-masking operation.

As described above, since new parity is generated using changed data only, a data read time and power consumption may be reduced. Also, the new parity generating operation may be performed every section. In particular, a memory system according to an embodiment of the inventive concepts may be advantageous to the case that data is changed by a small unit.

III. Partial Data Changing Method Including Error Detection and Correction

Returning to the equation 4, if a first section of data is changed, new parity $P0_{new}$ may be expressed by:

$$P0_{old}+D0_{dif}+D1_{dif}+D2_{dif}+D3_{dif}+D4_{dif}+D5_{dif}+D6_{dif}+D7_{dif}$$

If the first section of data to be changed is erroneous, the new parity $P0_{new}$ may be also erroneous.

In the event that data to be changed is erroneous, an error of new parity may be prevented by detecting and correcting an error early. Below, data in each section may be referred to as partial data.

FIGS. 16 and 17 are tables illustrating a data structure for error detection or correction of partial data. FIG. 16 is a data structure for error detection of partial data. FIG. 17 is a data structure for error correction of partial data.

Referring to FIG. 16, whole data may be divided into n partial data. At a data encoding operation, parity for error detection of each partial data and parity for error correction of the whole data may be generated. Referring to FIG. 17, parity for error correction of each partial data and parity for error correction of the whole data may be generated.

Figure 18:
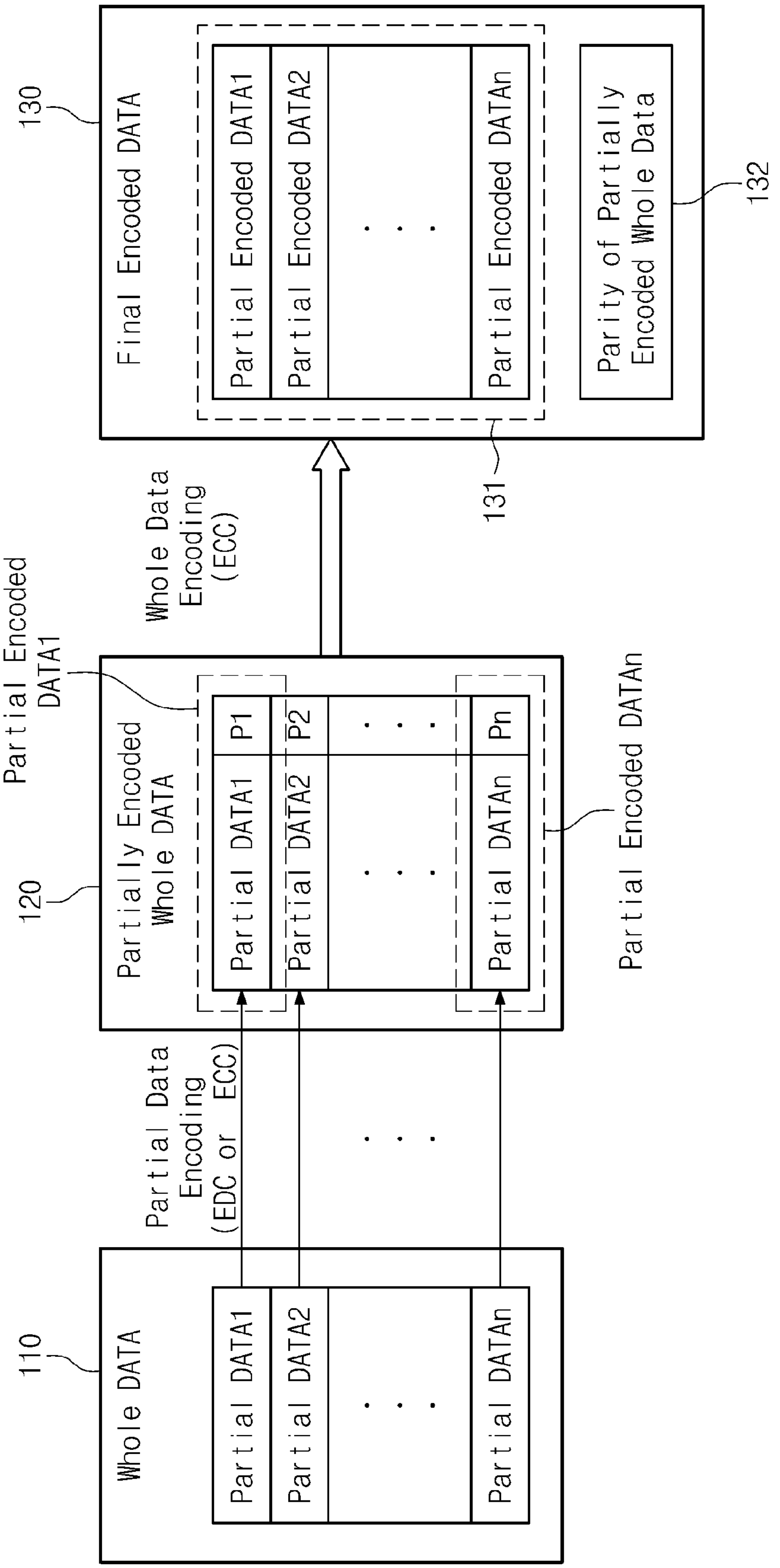
FIGS. 18 and 19 are conceptual diagrams illustrating orders of partial data encoding and whole data encoding.
Figure 19:
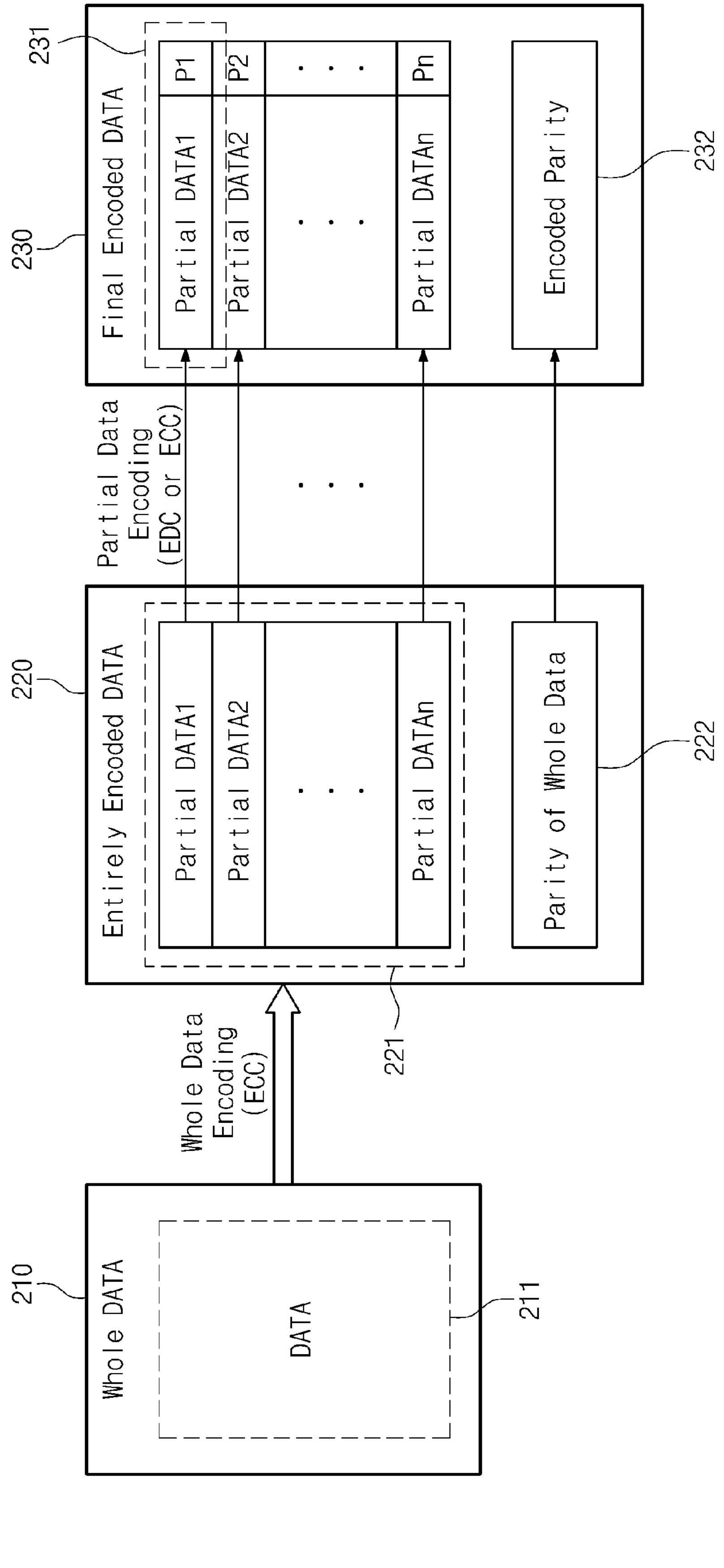

FIGS. 18 and 19 are conceptual diagrams illustrating orders of partial data encoding and whole data encoding. FIG. 18 shows a method in which partial data encoding is first performed and then whole data encoding is performed.

Referring to FIG. 18, whole data 110 may be divided into n partial data sections Partial DATA1 to Partial DATAn (n being a natural number). A partial data encoding operation may be performed with respect to each partial data. Herein, parity for error detection or correction may be generated at the partial data encoding operation.

The whole data 110 formed of n partial data sections Partial DATA1 to Partial DATAn may become a partially encoded whole data 120 through a partial data encoding operation for EDC or ECC. The partially encoded whole data 120 may be formed of n partial coded data Partial Encoded DATA1~DATAn, each of which includes partial data and parity.

For example, first partial data Partial DATA1 may become first partial coded data Partial Encoded DATA1 through a partial data encoding operation for EDC or ECC. The first partial coded data Partial Encoded DATA1 may be formed of the first partial data Partial DATA1 and first parity P1. Likewise, nth partial coded data Partial Encoded DATAn may be formed of nth partial data Partial DATAn and nth parity Pn.

The partially encoded whole data 120 may become final coded data 130 through a whole data encoding operation for ECC. The final coded data 130 may be formed of partially coded whole data 131 and parity 132. Herein, the parity 132 may be parity on the partially coded whole data 131.

FIG. 19 shows a method in which whole data encoding is performed and then partial data encoding is performed. Referring to FIG. 19, whole data 210 may become entirely encoded data 220 through a whole data encoding operation for ECC.

The entirely encoded data 220 may be formed of whole data 221 and parity 222 of the whole data 221. In FIG. 19, dotted lines 211 and 221 may indicate whole data before dividing into partial data sections. The parity 222 may be used to correct an error of the whole data.

Referring to FIG. 19, the whole data 221 may be divided into first to nth partial data sections Partial DATA1 to Partial DATAn. A partial data encoding operation for EDC or ECC may be executed with respect to each partial data. Herein, parity for error detection or correction may be generated at a partial data encoding operation.

The whole data 221 formed of n partial data Partial DATA1 to Partial DATAn may become partially encoded data through a partial data encoding operation for EDC or ECC. For example, first partial data Partial DATA1 may become first partial coded data Partial Encoded DATA1 231. The first partial coded data Partial Encoded DATA1 231 may be formed of the first partial data Partial DATA1 and first parity P1.

Parity 222 of the whole data may become encoded parity through a partial data encoding operation for EDC or ECC. Herein, the encoded parity 232 may be generated by encoding parity 222 of the whole data.

Figure 20:
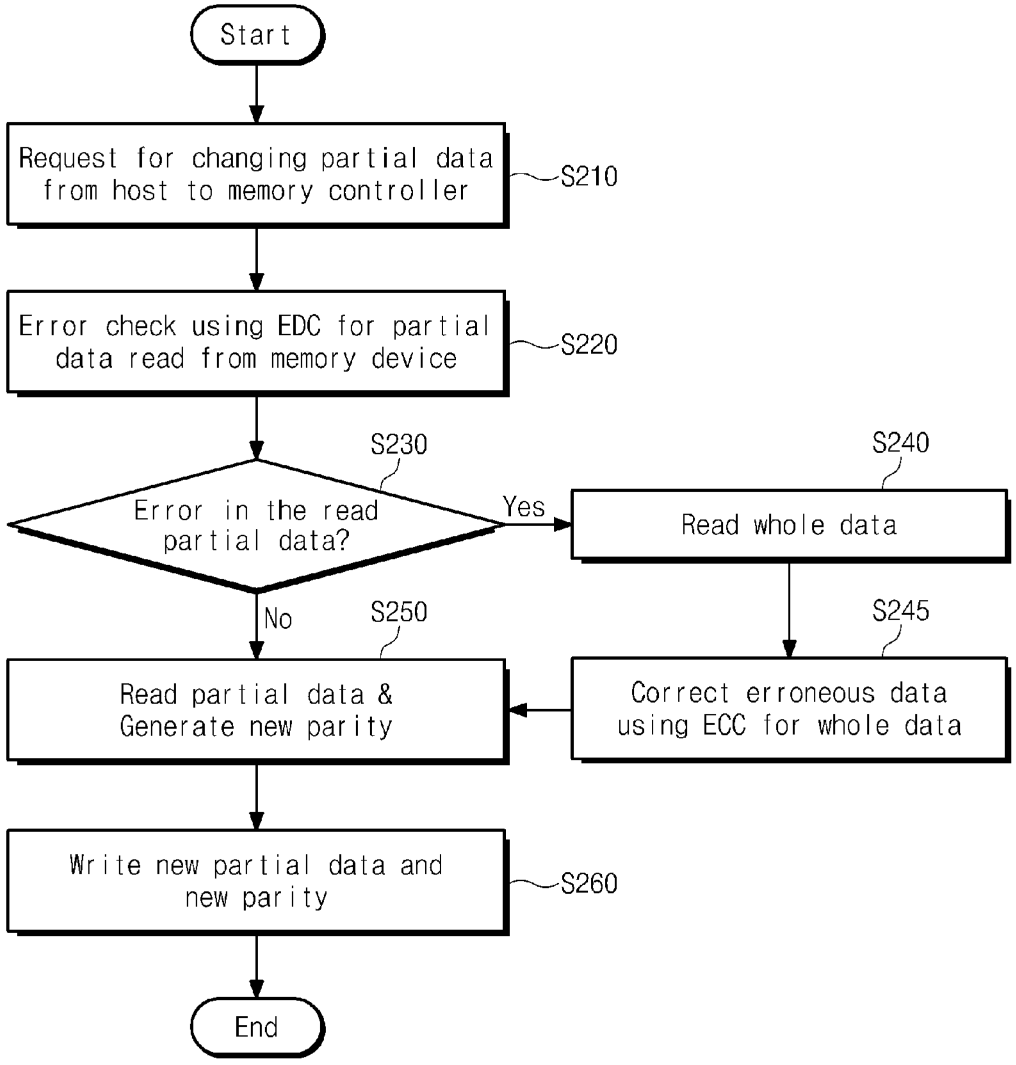
FIGS. 20 and 21 are flow charts illustrating a partial data changing method in which an error detection or correction operation of a memory system according to an embodiment of the inventive concepts is executed.
Figure 21:
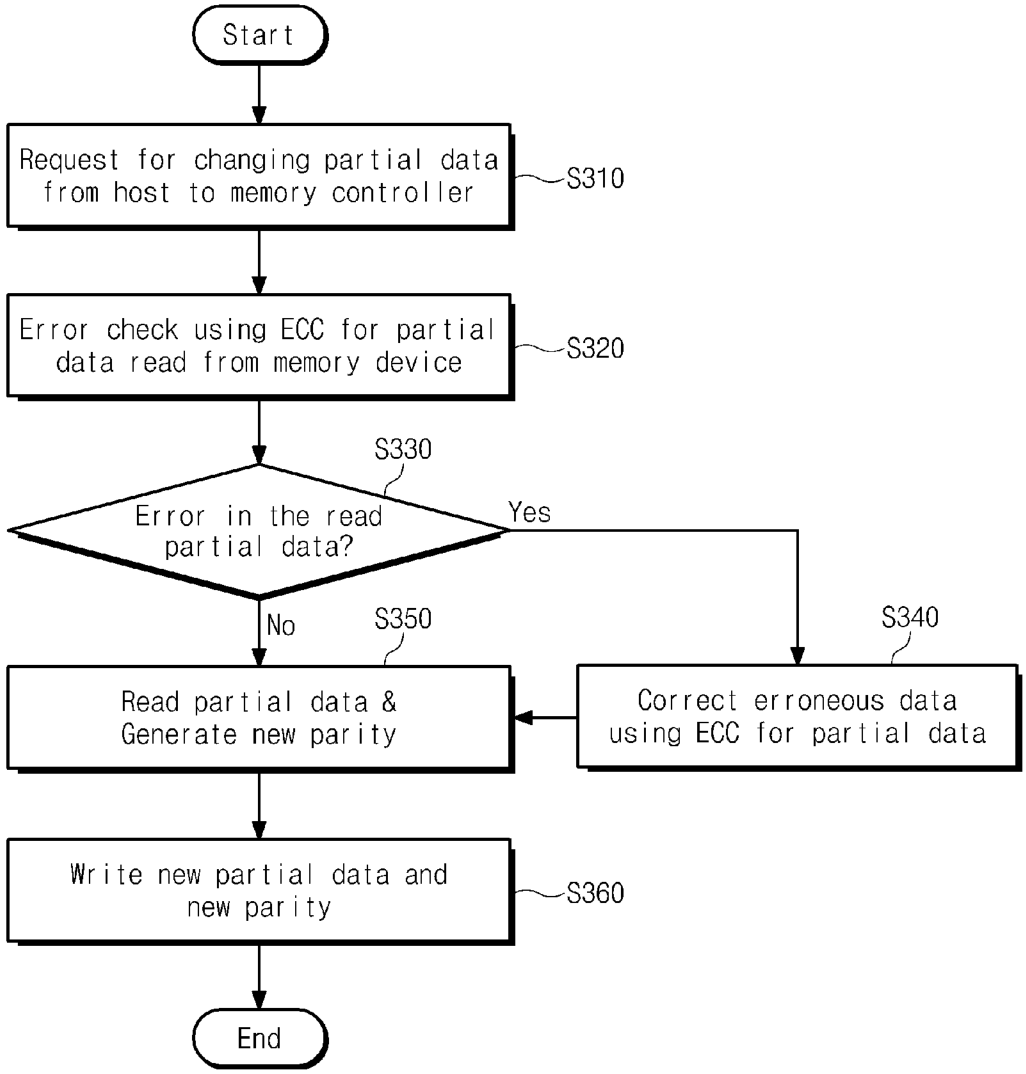

FIGS. 20 and 21 are flow charts illustrating a partial data changing method in which an error detection or correction operation of a memory system according to an embodiment of the inventive concepts is executed. FIG. 20 shows a partial data encoding operation for EDC. FIG. 21 shows a partial data encoding operation for ECC.

Referring to FIG. 20, in operation S210, a host 1300 (refer to FIG. 1) may request a change of partial data at a memory controller 1200 (refer to FIG. 1).

In operation S220, the memory controller 120 may check an error using EDC for partial data read from a memory device 1100 (refer to FIG. 1). Herein, the partial data read from the memory device 1100 may be old data $D_{old}$. Old data $D_{old}$ and an old parity $P_{old}$ for EDC may be stored at the memory device 1100.

In operation S230, the memory controller 1200 may determine whether the partial data read from the memory device 1100 is erroneous. If so, the method proceeds to operation S240, in which whole data is read. In operation S245, a data error may be corrected using ECC for the whole data.

In the case that an error is not detected in operation S240 or an error is corrected in operation S245, in operation S250, the memory controller 1200 may read partial data to generate new parity $P_{new}$. That is, as described with reference to FIG. 12, the new parity may be generated using a data difference $D_{dif}$ between new data $D_{new}$ and old data $D_{old}$ and an old parity $P_{old}$.

In operation S260, the new partial data and the new parity $P_{new}$ may be stored at the memory device 1100.

Referring to FIG. 21, in operation S310, a change of partial data may be requested.

In operation S320, an error may be checked using ECC for partial data read from the memory device 1100. Old data $D_{old}$ and an old parity $P_{old}$ for ECC may be stored at the memory device 1100.

In operation S330, the memory controller 1200 may determine whether the partial data read from the memory device 1100 is erroneous. If so, the method proceeds to operation S340, in which the memory controller 1200 correct a data error using ECC for partial data.

In the case that an error is not detected in operation S330 or an error is corrected in operation S340, in operation S350, the memory controller 1200 may read partial data to generate a new parity $P_{new}$. In operation S360, the new partial data and the new parity $P_{new}$ may be stored at the memory device 1100.

As described above, since new parity is generated using changed data only, a data read time and power consumption may be reduced. In example embodiments, a new parity generating operation may be executed every section. If partial data to be changed is erroneous, an error of new parity may be prevented by detecting and correcting an error early.

IV. Applications

Figure 22:
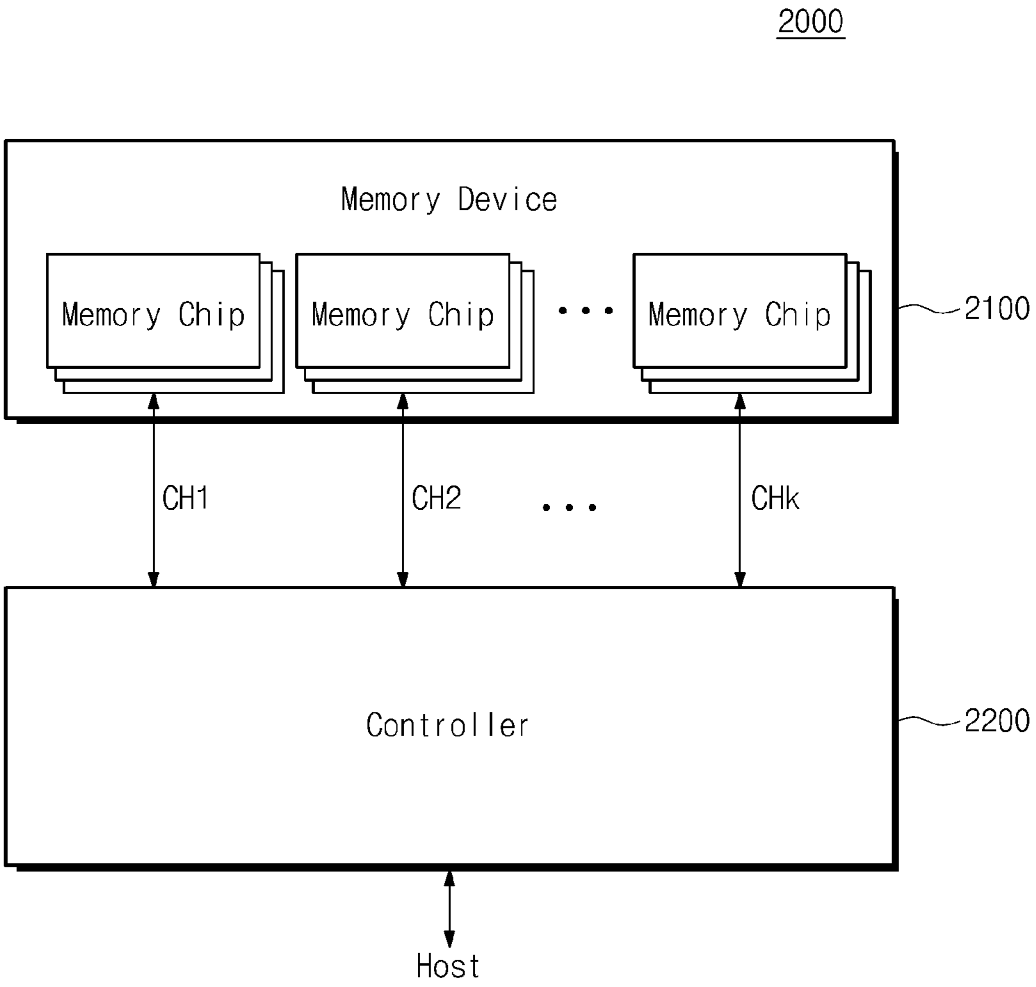
FIG. 22 is a block diagram schematically illustrating an application of a memory system of FIG. 1.

FIG. 22 is a block diagram schematically illustrating an application of a memory system of FIG. 1. Referring to FIG. 22, a memory system 2000 may include a memory device 2100 and a memory controller 2200 which may have the structure and operation discussed above with respect to memory device 1100 and memory controller 120, respectively, according to at least one example embodiment.

The memory device 2100 may include a plurality of memory chips. The memory chips may be divided into a plurality of groups. Memory chips in each group may be configured to communicate with the memory controller 2200 via a common channel. In FIG. 22, there is illustrated an example in which a plurality of memory chips communicates with the memory controller 2200 via a plurality of channels CH1 to CHk.

Figure 23:
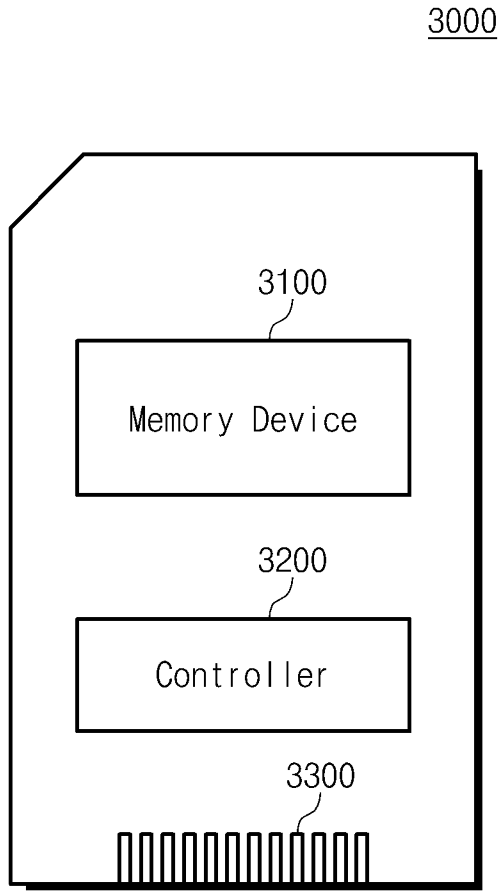
FIG. 23 is a block diagram schematically illustrating a memory card implemented by a memory system according to an embodiment of the inventive concepts.

FIG. 23 is a block diagram schematically illustrating a memory card implemented by a memory system according to an embodiment of the inventive concepts. Referring to FIG. 23, a memory card 3000 may include a memory device 3100, a memory controller 3200, and a connector 3300. According to at least one example embodiment, the memory device 3100 and memory controller 3200 may have the structure and operation discussed above with respect to memory device 1100 and memory controller 1200, respectively.

The connector 3300 may connect the memory card 300 electrically with a host. The memory card 3000 may include memory cards such as a PC card (PCMCIA: personal computer memory card international association), a compact flash (CF) card, a smart media card (SM, SMC), a memory stick, a multimedia card (MMC, RS-MMC, MMCmicro), an SD card (SD, miniSD, microSD, SDHC), a universal flash storage device (UFS), and so on.

Figure 24:
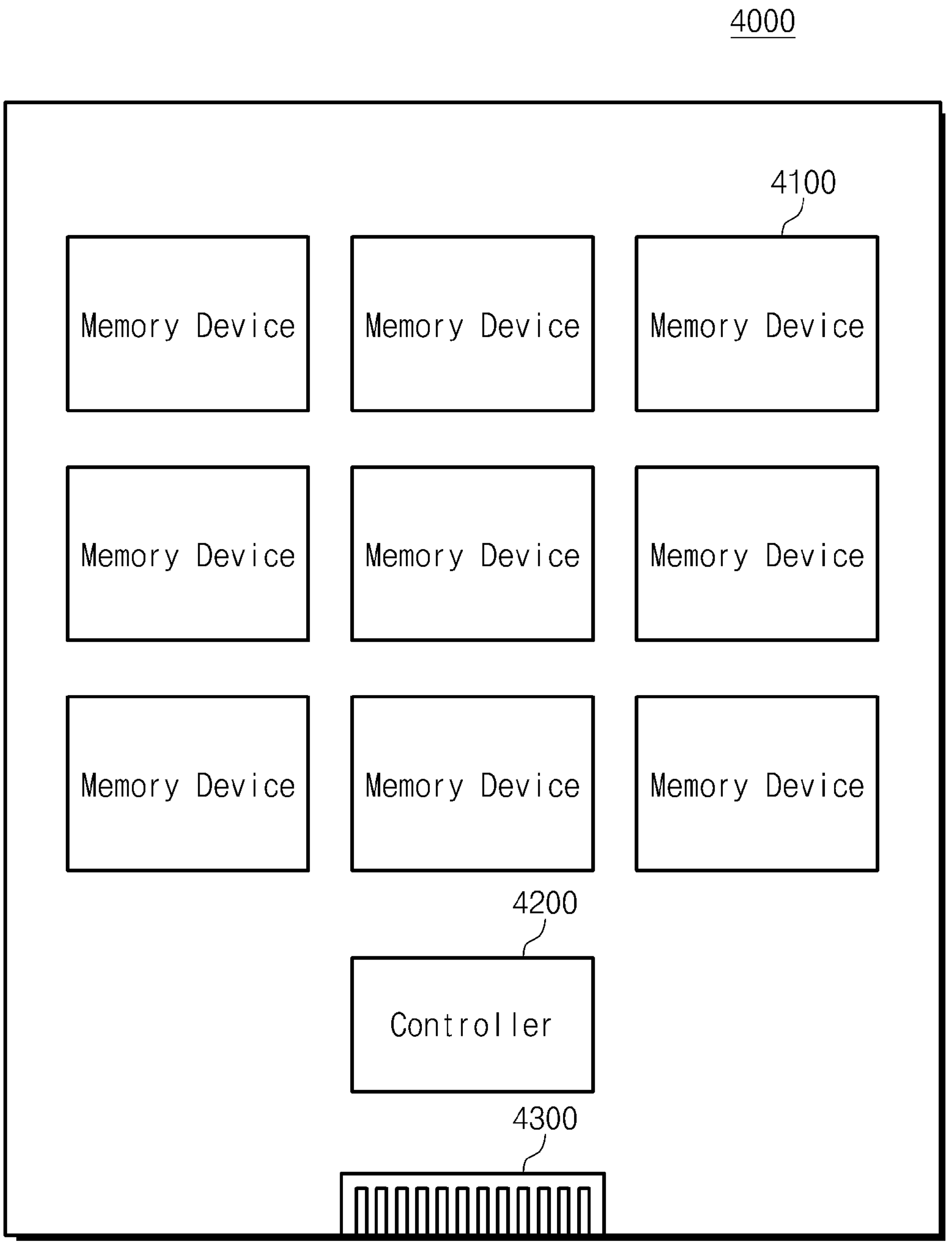
FIG. 24 is a block diagram schematically illustrating a solid state drive implemented by a memory system according to an embodiment of the inventive concepts.

FIG. 24 is a block diagram schematically illustrating a solid state drive implemented by a memory system according to an embodiment of the inventive concepts. Referring to FIG. 24, a solid state drive 4000 may include a plurality of memory devices 4100, a memory controller 4200, and a connector 4300. The connector 4300 may connect the solid state drive 4000 electrically with a host. According to at least one example embodiment, each of the memory devices 4100 may have the structure and operation discussed above with respect to memory device 1100, and the controller 4200 may have the structure and operation discussed above with respect to the memory controller 1200.

Figure 25:
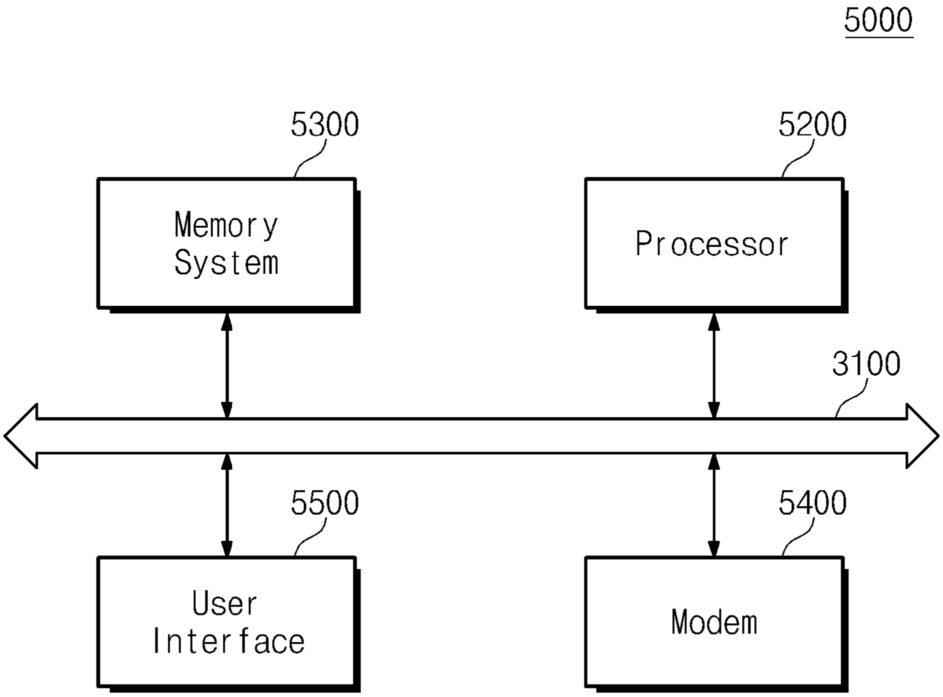
FIG. 25 is a block diagram schematically illustrating a computing system to which a memory system according to an embodiment of the inventive concepts is applied.

FIG. 25 is a block diagram schematically illustrating a computing system to which a memory system according to an embodiment of the inventive concepts is applied. Referring to FIG. 25, a computing system 5000 may include a bus 5100, a processor 5200, a memory system 5300, a modem 5400, and a user interface 5500.

The bus 5100 may provide a channel among components of the computing system 5000. The processor 5200 may control an overall operation of the computing system 5000, and may perform a logical operation. The memory system 5300 may include a memory system 1000 or 2000 according to an embodiment of the inventive concepts.

The memory system 5300 may be used as a working memory or storage of the computing system 5000. The working memory may be a storage space used for the processor 5200 to control the computing system 5000. The storage may be a storage space used for the computing system 5000 to retain data in the long term.

When the memory system 5300 is used as a working memory, the computing system 5000 may further comprise separate storage. When the memory system 5300 is used as storage, the computing system 5000 may further comprise a separate working memory. The modem 5400 may communicate with an external device in a wire or wireless manner.

According to at least one example embodiment, the memory system 5300 may include a memory device that has the structure and operation discussed above with respect to memory device 1100, and the memory system 5300 may include a memory controller that has the structure and operation discussed above with respect to the memory controller 1200.

The user interface 5500 may include user input interfaces such as a camera, a keyboard, a mouse, a microphone, a touch panel, a touch pad, a button, a sensor, and so on. The user interface 5500 may further include user output interfaces such as a display, a speaker, a ramp, a motor, and so on.

The computing system 5000 may be a mobile multimedia device such as a smart phone, a smart pad, or the like or a multimedia device such as a notebook computer, a smart television, a computer, a smart monitor, or the like.

While the inventive concepts has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A partial data changing method of a memory controller comprising:

receiving a request to change partial data from a host;

detecting an error of old data, the old data being partial data read from a memory device;

calculating a data difference between new data provided from the host and the old data;

calculating a new parity using the data difference and an old parity read from the memory device, the old parity being a parity corresponding to the old data, the new parity being a parity corresponding to the new data; and storing the new data and the new parity at the memory device.

2. The partial data changing method of claim 1, further comprising:

reading whole data from the memory device when the old data is erroneous; and correcting the error of the old data using an error correction code, and wherein the error of the old data is detected using an error detection code, and the calculating the data difference is performed if the old data is not erroneous.

3. The partial data changing method of claim 2, wherein the calculating the data difference includes, after the error of the old data is corrected, calculating the data difference between the new data provided from the host and the error-corrected old data, and the calculating the new parity includes calculating the new parity using the data difference and the old parity read from the memory device.

4. The partial data changing method of claim 3, further comprising:

performing a partial data encoding operation of dividing whole data to be stored at the memory device into a plurality of partial data, generating a parity for an error detection code of each partial data, and generating partial encoded data.

5. The partial data changing method of claim 4, further comprising:

performing a whole data encoding operation of generating a parity for an error correction code of all the partial encoded data corresponding to the plurality of partial data after the partial data encoding operation.

6. The partial data changing method of claim 2, further comprising:

performing a whole data encoding operation including generating a parity for an error correction code of whole data to be stored at the memory device.

7. The partial data changing method of claim 6, further comprising:

after the whole data encoding operation is performed, dividing the whole data into a plurality of partial data, the whole data being data to be stored at the memory device; and generating a parity for an error detection code of the whole data.

8. The partial data changing method of claim 7, further comprising:

performing a partial data encoding operation of generating a parity of an error detection code of each of the plurality of partial data and generating partial encoded data.

9. The partial data changing method of claim 8, wherein at the partial data encoding operation, encoded parity on the whole data generated at the whole data encoding operation is generated.

10. The partial data changing method of claim 1, further comprising:

if the old data is erroneous, correcting the error of the old data, wherein the error of old data is detected using an error correction code, and wherein, if the error of the old data is corrected, the calculating the data difference is performed between the new data provided from the host and the error-corrected old data.

11. The partial data changing method of claim 10, further comprising:

storing the new data and the new parity at the memory device.

12. The partial data changing method of claim 10, further comprising:

performing a partial data encoding operation of dividing whole data to be stored at the memory device into a plurality of partial data, generating a parity for an error correction code of each of the plurality of partial data, and generating partial encoded data; and performing a whole data encoding operation of generating a parity for an error correction code of all the partial encoded data corresponding to the plurality of partial data after the partial data encoding operation.

13. The partial data changing method of claim 10, further comprising:

performing a whole data encoding operation of generating a parity for an error correction code of whole data to be stored at the memory device; and after the whole data encoding operation is performed, dividing the whole data into a plurality of partial data and generating a parity for an error correction code of the whole data.

14. The partial data changing method of claim 13, further comprising:

performing a partial data encoding operation of generating a parity of an error correction code of each of the plurality of partial data and generating partial encoded data.

15. The partial data changing method of claim 14, wherein at the partial data encoding operation, an encoded parity on the whole data generated at the whole data encoding operation is generated.

16. The partial data changing method of claim 10, further comprising:

if the partial data read from the memory device is not erroneous, the calculating the data difference includes calculating the data difference between the new data provided from the host and the old data and the calculating the new parity includes calculating the new parity using the data difference and the old parity read from the memory device.

17. The partial data changing method of claim 10, wherein the memory device is a volatile memory device.

18. The partial data changing method of claim 10, wherein the memory device is a nonvolatile memory device.

19. A memory controller for generating a new parity when partial data of a memory device is changed, comprising:

a data location identifier configured to identify a location of the changed partial data;

a data difference calculator configured to receive location information of the changed partial data from the data location identifier and to calculate a data difference between new data input from a host and old data input from the memory device; and a parity calculator configured to calculate the new parity using an old parity stored at the memory device and the data difference, the old parity being a parity corresponding to the old data, the new parity being a parity corresponding to the new data.

20. The memory controller of claim 19, wherein the data location identifier, the data difference calculator, and the parity calculator are included in a new parity generator.

21. The memory controller of claim 19, wherein the data difference calculator is configured to process unmodified data of data stored at the memory device to be set to 0 and calculate the data difference between the new data and the old data.

22. The memory controller of claim 19, wherein the data difference calculator is configured to divide the changed partial data into a plurality of sections and calculate the data difference between the new data and the old data with respect to each of the plurality of sections.

23. The memory controller of claim 19, wherein the data difference calculator is configured to calculate the data difference between the new data and the old data using an XOR operation.

24. A memory system comprising:

a memory device configured to store data and a parity;

a host configured to provide new data for changing partial data stored at the memory device and location information of the changed partial data; and a memory controller configured to receive the new data and the location information from the host, to calculate a data difference between the new data provided from the host and old data input from the memory device, and to generate a new parity using an old parity stored at the memory device and the data difference, the old parity being a parity corresponding to the old data, the new parity being a parity corresponding to the new data.

25. The memory system of claim 24, wherein the memory controller comprises:

a data location identifier configured to identify a location of the changed partial data;

a data difference calculator configured to receive the location information from the data location identifier and to calculate the data difference between the new data and the old data; and a parity calculator configured to calculate the new parity using the old parity and the data difference.

26. The memory system of claim 24, wherein the data difference calculator is configured to process unmodified data of the data stored at the memory device to be set to 0 and calculate the data difference between the new data and the old data.

27. The memory system of claim 24, wherein the data difference calculator is configured to divide the changed partial data into a plurality of sections and calculate the data difference between the new data and the old data with respect to each of the plurality of sections.

28. A method of operating a memory controller to update parity information, the method comprising:

determining, at the memory controller, a first parity, the first parity being a parity corresponding to an entirety of first data stored in a memory device, the first data including a first portion and a second portion;

receiving a request to replace the first portion with new data;

generating, at the memory controller, a data difference based on the new data and the first portion;

updating the first parity by generating, at the memory controller, a new parity of the first data based on the data difference and the first parity; and replacing the first portion in the first data with the new data by storing the new data and the new parity at the memory device.

29. The method of claim 28, wherein the memory controller performs the operations of generating the data difference and generating the new parity without using the second portion, and the new parity corresponds to the entirety of the first data including the new data and the second portion.

30. The method of claim 28, wherein the first portion includes contiguous bits of the first data, the second portion includes contiguous bits of the first data, and the first and second portions do not overlap with one another.

* * * * *